(12) United States Patent
Attaway et al.

(10) Patent No.: US 6,829,677 B1
(45) Date of Patent: Dec. 7, 2004

(54) METHOD AND APPARATUS FOR PRESERVING THE CONTENTS OF SYNCHRONOUS DRAM THROUGH SYSTEM RESET

(75) Inventors: David Lawrence Attaway, Austin, TX (US); Leonard F. Chetti, Cedar Park, TX (US); Richard Nicholas Iachetta, Jr., Pflugerville, TX (US); Suksoon Yong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/574,186

(22) Filed: May 18, 2000

(51) Int. Cl.[7] .............................................. G06F 12/00
(52) U.S. Cl. ...................... 711/106; 711/166; 711/167; 365/229; 713/1
(58) Field of Search ................................ 711/106, 104, 711/105, 166, 167; 365/222, 238, 191, 226, 227, 229, 230.01; 713/1

(56) References Cited

U.S. PATENT DOCUMENTS

| | | | | |
|---|---|---|---|---|
| 5,204,840 A | * | 4/1993 | Mazur ......................... | 711/106 |
| 5,630,090 A | * | 5/1997 | Keehn et al. ................ | 711/106 |
| 5,640,357 A | * | 6/1997 | Kakimi ........................ | 365/222 |
| 6,088,762 A | * | 7/2000 | Creta .......................... | 365/222 |
| 6,119,200 A | * | 9/2000 | George ........................ | 711/106 |
| 6,229,749 B1 | * | 5/2001 | Cowles et al. .............. | 365/222 |
| 6,310,819 B1 | * | 10/2001 | Cowles et al. ............. | 365/233 |
| 6,317,657 B1 | * | 11/2001 | George ........................ | 365/222 |
| 6,487,648 B1 | * | 11/2002 | Hassoun ...................... | 711/167 |

OTHER PUBLICATIONS

OptiMagic Inc., "Frequently Asked Questions about Programmable Logic", © 1997–2001, pp. 1–18.*

* cited by examiner

Primary Examiner—Pierre-Michel Bataille
(74) Attorney, Agent, or Firm—Duke W. Yee; Robert M. Carwell; Stephen J. Walder, Jr.

(57) ABSTRACT

A method, system, and apparatus for maintaining the contents of a self-refreshable memory device during periods of data processing system reset is provided. In one embodiment, a refresh controller receives an indication that the data processing system is being reset. If necessary, the refresh controller modifies the signal from a memory controller to the memory device such that the memory device is placed in a self-refresh mode. The refresh controller keeps the memory device in the self-refresh mode until the data processing system re-enables external refresh signals.

13 Claims, 4 Drawing Sheets

METHOD AND APPARATUS FOR PRESERVING THE CONTENTS OF SYNCHRONOUS DRAM THROUGH SYSTEM RESET

BACKGROUND OF THE INVENTION

1. Technical Field:

The present invention relates generally to computer memory and, more particularly, to preserving the contents of synchronous dynamic random access memory during system reset.

2. Description of Related Art:

Usually, when a memory controller is reset, the current state of the memory need not be preserved. However, some design applications require that the contents of memory be preserved during reset so that they can be accessed again after reset. For example, in the case of a hung (i.e., frozen) system, the operator may wish to press the reset button without powering off the system. When the system boots up again, the operator may wish to have the option of querying the contents of the memory in order to try to understand the cause of the previous system hang. Alternatively, the operator may wish to recover data from the memory that was unsaved prior to the system freezing. Of course, in these cases, the boot code would have to provide a means to enter this diagnostic mode before it ever writes to system memory.

One significant problem to overcome in preserving the memory contents in synchronous dynamic random access memory (SDRAM) is maintaining refresh. SDRAM, like other kinds of DRAM, requires refresh cycles to occur with regular frequency. If a certain maximum time, which is dependent upon technology and memory size, is exceeded between refresh cycles, the memory will become corrupted. When a memory controller is reset, all of its internal registers return to their default state. This means that the controller will stop refreshing the memory until it is re-initialized by software. Since the time between the beginning of reset and memory controller re-initialization is variable and will usually be longer than the maximum allowable time between refresh cycles, there is a high probability that memory will become corrupted during this time.

It is not an option to simply exclude the memory controller from seeing certain types of resets. Because a system hang can be caused by countless things, it is necessary to restore all hardware, including the memory controller to their default state during all resets in order to successfully reboot the machine. Since the default state of system memory is random to begin with, preserving its contents will not hinder the reboot process. Therefore, an apparatus and method for adding the functionality of refreshing the memory during certain types of reset signals to new as well as existing architectures is desirable.

SUMMARY OF THE INVENTION

The present invention provides a method, system, and apparatus for maintaining the contents of a self-refreshable memory device during periods of data processing system reset. In one embodiment, a refresh controller receives an indication that the data processing system is being reset. If necessary, the refresh controller modifies the signal from a memory controller to the memory device such that the memory device is placed in a self-refresh mode. The refresh controller keeps the memory device in the self-refresh mode until the data processing system re-enables external refresh signals.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
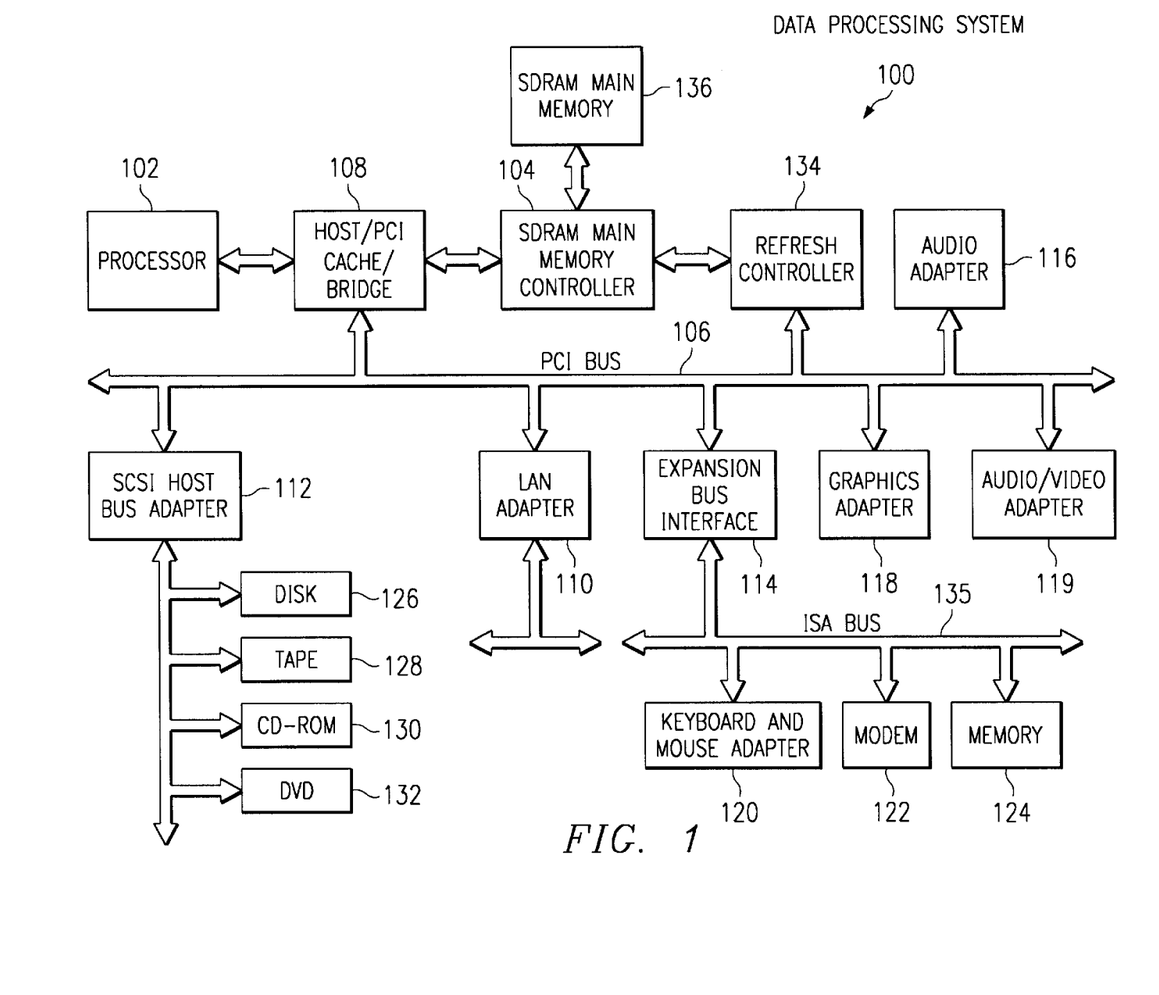
FIG. 1 is a block diagram of a data processing system in which the present invention may be implemented.

With reference now to FIG. 1, a block diagram of a data processing system in which the present invention may be implemented is illustrated. Data processing system 100 employs a peripheral component interconnect (PCI) local bus architecture. Although the depicted example employs a PCI bus, other bus architectures, such as Micro Channel and ISA, may be used. Processor 102 and synchronous dynamic random access memory (SDRAM) main memory controller 104 are connected to PCI local bus 106 through PCI bridge 108. PCI bridge 108 may also include a cache memory for processor 102. SDRAM main memory controller 104 is also connected to SDRAM main memory 136 and to refresh controller 134.

Additional connections to PCI local bus 106 may be made through direct component interconnection or through add-in boards. In the depicted example, local area network (LAN) adapter 110, SCSI host bus adapter 112, and expansion bus interface 114 are connected to PCI local bus 106 by direct component connection. In contrast, audio adapter 116, graphics adapter 118, and audio/video adapter,(A/V) 119 are connected to PCI local bus 106 by add-in boards inserted into expansion slots. Expansion bus interface 114, through ISA bus 135, provides a connection for a keyboard and mouse adapter 120, modem 122, and additional memory 124. In the depicted example, SCSI host bus adapter 112 provides a connection for hard disk drive 126, tape drive 128, CD-ROM drive 130, and digital video disc read only memory drive (DVD-ROM) 132. Typical PCI local bus implementations will support three or four PCI expansion slots or add-in connectors.

An operating system runs on processor 102 and is used to coordinate and provide control of various components within data processing system 100 in FIG. 1. The operating system may be a commercially available operating system, such as OS/2, which is available from International Business Machines Corporation. "OS/2" is a trademark of International Business Machines Corporation. An object oriented programming system, such as Java, may run in conjunction with the operating system, providing calls to the operating system from Java programs or applications executing on data processing system 100. Instructions for the operating system, the object-oriented operating system, and applications or programs are located on a storage device, such as hard disk drive 126, and may be loaded into main memory 104 for execution by processor 102.

SDRAM main memory controller 104 includes the capability to place SDRAM main memory 136 into a self-refresh mode in response to certain commands from the data processing system. The present invention requires that the data processing system put the SDRAM controller into self-refresh mode in response to certain kinds of reset signals, such as "button" reset. SDRAM main memory 136 requires the contents of the memory to be periodically refreshed. If the SDRAM main memory 136 is not refreshed for a prolonged period of time, the contents within SDRAM main memory 136 will be lost. During self-refresh mode, SDRAM main memory 136 does not require external refresh cycles to be run, but SDRAM main memory 136 is inaccessible during this time. However, the contents within SDRAM main memory 136 are preserved until the system re-enables external refresh of SDRAM main memory 136.

Also connected to SDRAM main memory controller 104 is refresh controller 134. Refresh controller 134 is an additional component that prevents SDRAM main memory 136 from prematurely exiting self-refresh mode during periods of interrupt, such as, for example, during a reboot of the system. By preventing SDRAM main memory 136 from prematurely exiting self-refresh mode, the contents of SDRAM main memory 136 prior to reboot or other system interrupt, are available to the system after the reboot process has completed.

To aid in understanding the importance and function of refresh controller 134, consider the following example. Suppose a user presses the "button" reset on data processing system 100. Since the reset signals are tied to interrupt rather than fed directly into reset logic of data processing system 100, an interrupt will be taken. The interrupt service routine will first idle all SDRAM banks of SDRAM main memory 136. Next, in step two, SDRAM main memory controller 104 will place SDRAM main memory 136 into self-refresh mode at the request of the interrupt service routine running on the data processing system. Finally, in step three, the interrupt service routine will activate the system reset via software (a mechanism that is usually available within data processing systems). In step two, SDRAM main memory controller 104 will drive the clock enable (CKE) to the low state after it sends some commands to SDRAM memory which put the memory in the self-refresh state. However, if the refresh controller 134 is not used, the interrupt service routine, in step three, will bring CKE back to the default high (enabled) state because system reset returns all devices to their default state. If the CKE is driven back high, then SDRAM main memory 134 will exit self-refresh mode and will lose data before the boot code re-initializes SDRAM main memory controller 104. Thus, the extra circuit, which is provided by refresh controller 134, is required to hold CKE low when the reset signal is released. CKE must be held inactive until the boot code finishes reinitializing SDRAM main memory controller 104.

Those of ordinary skill in the art will appreciate that the hardware in FIG. 1 may vary depending on the implementation. For example, other peripheral devices, such as optical disk drives and the like, may be used in addition to or in place of the hardware depicted in FIG. 1. The depicted example is not meant to imply architectural limitations with respect to the present invention. For example, the processes of the present invention may be applied to multiprocessor data processing systems.

Figure 2:
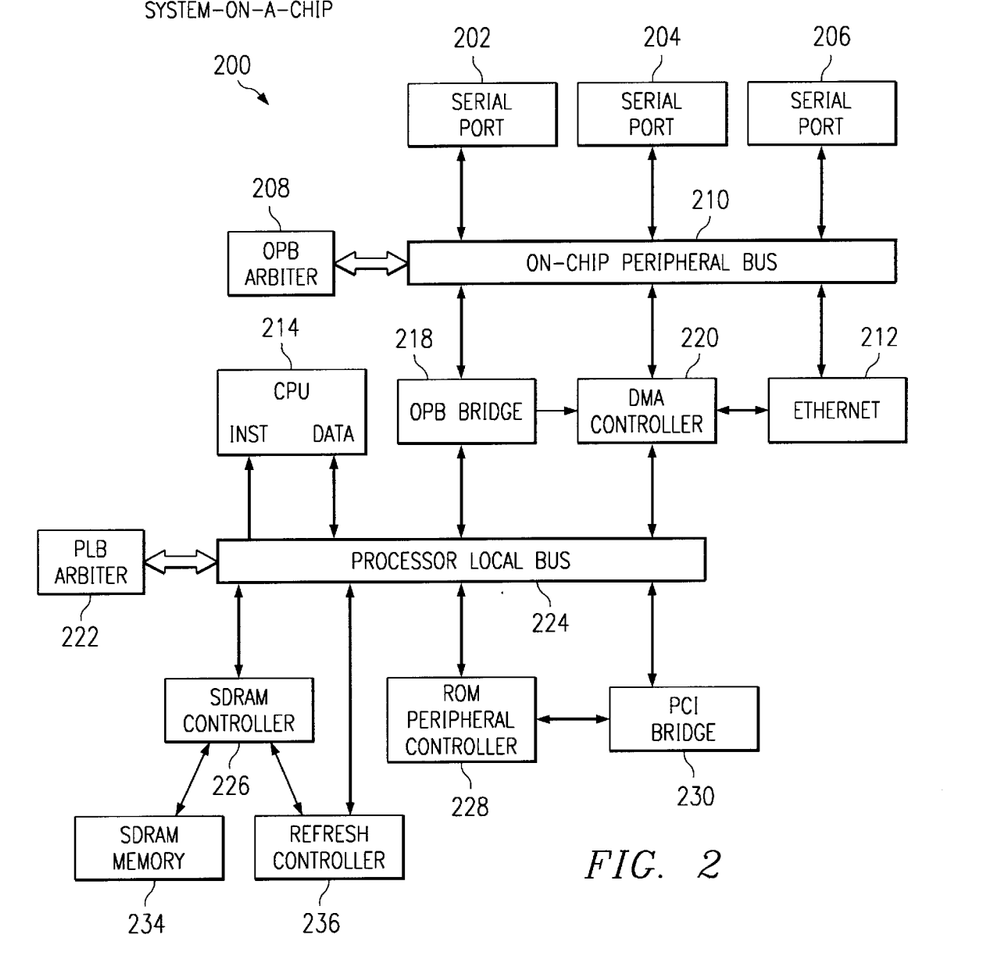
FIG. 2 depicts a block diagram of a System-On-a-Chip in which the present invention may be implemented.

With reference now to FIG. 2, a block diagram of a System-On-a-Chip is depicted in which the present invention may be implemented. System-On-a-Chip 200 employs a Processor Local Bus (PLB) local bus architecture. However, other bus architectures may be utilized as well. Processor Local Bus 224 hosts high performance, high bandwidth blocks, such as CPU 214, which is connected to Processor Local Bus (PLB) 224. In the depicted example, CPU 214 is a Power-PC 405 CPU core. Also connected to Processor Local Bus 224 is a ROM Peripheral Controller 228, an SDRAM Controller 226, and a direct memory access (DMA) controller 220. DMA controller 220 is specialized circuitry or a dedicated microprocessor that transfers data from memory to memory without using CPU 214. PCI Bridge 230 provides a interface for devices on Processor Local Bus 224 to communicate with PCI devices on a PCI bus outside of System on a Chip 200. PLB Arbiter receives request for PCI Processor Local Bus 224 and determines which device receives access to PCI Processor Local Bus 224 next.

System-On-a-Chip 200 also include On-Chip Peripheral (OPB) Bus 210 for hosting lower data rate peripherals, such as serial ports 202–206 and ethernet 212. Serial ports 202–206 provide connections between System-On-a-chip 200 and devices and components external to System-On-a-Chip 200. Ethernet 212 provides a connection to an external network. OPB Arbiter 208 receives requests for OPB Bus 210 and determines which device receives access next. OPB Bus 210 is connected to Processor Local Bus 224 through OPB Bridge 218 and through DMA controller 220.

SDRAM Controller 226 is connected SDRAM memory 234 and to Refresh Controller 236. SDRAM controller 226 includes the capability to place SDRAM memory 234 into a self-refresh mode in response to requests from the data processing system. The data processing system will request that the SDRAM controller place the SDRAM into self refresh mode in response to certain kinds of reset signals, such as "button" reset. SDRAM memory 234 requires the contents of the memory to be periodically refreshed. During self-refresh mode, SDRAM memory 234 does not require external refresh cycles to be run. However, the contents within SDRAM memory 234 are preserved until System-On-a-Chip 200 re-enables external refresh of SDRAM memory 134.

Also connected to SDRAM controller 226 is refresh controller 236. Refresh controller 236 is an additional component that prevents SDRAM memory 234 from prematurely exiting self-refresh mode during periods of interrupt, such as, for example, during a reboot of the system. By preventing SDRAM memory 234 from prematurely exiting self-refresh mode, the contents of SDRAM memory 234 prior to reboot, or other system interrupt, are available to System-On-a-Chip 200 after the reboot process has completed. Refresh Controller 236 performs similarly to refresh controller 134 in FIG. 1.

System-On-a-Chip 200 is an example of a system-on-a-chip such as an application specific integrated circuit (ASIC) in which the present invention may be implemented. System-On-a-Chip 200 is given merely as an example and is not meant to imply any architectural limitations. System-On-a-Chip 200 could include other components not shown in FIG. 2.

Figure 3:
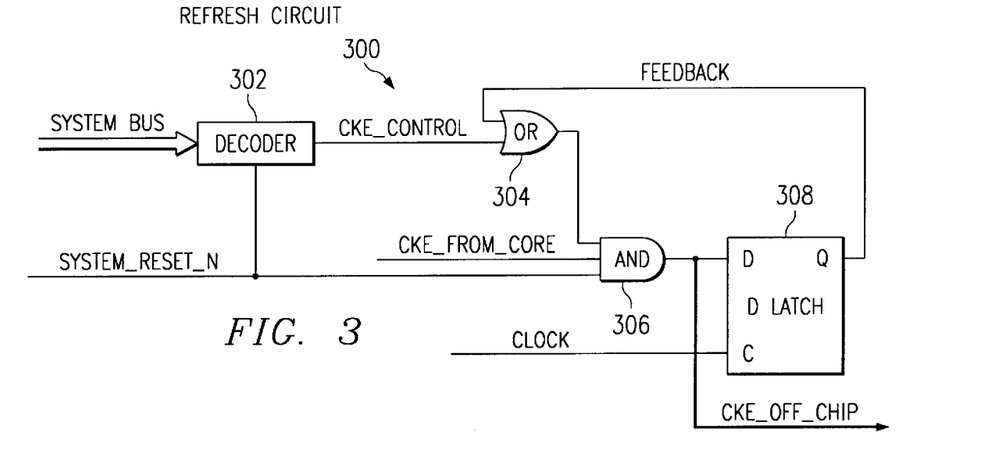
FIG. 3 depicts a diagram of a refresh control circuit to re-enable external refresh cycles in accordance with the present invention.

With reference now to FIG. 3, a diagram of a refresh control circuit to hold SDRAM memory in self-refresh mode until external refresh cycles are enabled is depicted in accordance with the present invention. Refresh control circuit 300 may be implemented as refresh controller 236 in FIG. 2 or, with slight modification as described below, as refresh controller 134 in FIG. 1. The bus logic for implementing the read/write clock enable control bit signal CKE_Control_Bit is inside decoder 302 but not shown. Refresh control circuit 300 may also reside in any programmable logic device such as a programmable array logic (PAL), which is a type of programmable logic chip containing arrays of programmable AND gates and predefined OR gates, or a field programmable array (FPGA) outside the chip containing the SDRAM controller.

Refresh control circuit 300 includes a decoder 302, an OR gate 304, an AND gate 306, and a D Flip-Flop latch 308. Decoder 302 contains a "decoder" of the system bus that decodes software communications with refresh control circuit 300. Decoder 302 also has a single register bit called CKE_Control that can be written (and, depending on implementation, may also be read) by the system via the decoder 302., The CKE_Control output from Decoder 302 is coupled to an input of OR gate 304. The output of OR gate 304 is coupled to an input of AND gate 306. Also coupled to inputs of AND gate 306 are the active low System-Reset signal System_Reset_N and the clock enable signal from the core CKE_From_Core. The output of AND gate 306 is coupled to the input of D Flip-Flop latch 308 and is sent off chip. The output of D Flip-Flop latch 308 is coupled to the second input of OR gate 304. The output CKE_Off_Chip of AND gate 306 is also coupled to an SDRAM memory. (not shown) to maintain the contents of the SDRAM memory during periods of reset.

The SDRAM memory is put into self-refresh mode by the SDRAM controller by issuing certain electronic commands on the SDRAM bus and then driving the clock enable output signal CKE_Off_Chip to the inactive low state. During normal operation, System_Reset_N is high (inactive), the clock enable control signal CKE_Control is high (active), the clock enable signal from the core CKE_From_Core is high (active) and so the clock enable signal output off chip CKE_Off_Chip and the feedback signal Feedback are high. In this mode, the core can assert and de-assert its active high enable signal CKE_From_Core and affect the clock enable signal output off the chip CKE Off_Chip as it normally can.

Only one level of logic 306 was added between the clock enable signal from the core CKE_From_Core and the clock enable output signal CKE_Off_Chip. Therefore, no difficult timing issues should be present to resolve in a modern application specific integrated circuit (ASIC).

When "button" reset or some other kind of special reset is asserted, the reset interrupt service routine will place the SDRAM controller into self-refresh mode. This will cause the clock enable signal from the core CKE_From_Core and thus clock enable off chip CKE_Off_Chip to become in active (low). The end of the interrupt service routine activates the reset signal System Reset_N low, which holds clock enable signal output CKE_Off_Chip low no matter what is happening on the clock enable signal from the core CKE_From_Core during reset. The clock enable control bit signal CKE_Control_bit is also set low by decoder 302 during a reset. This is typically accomplished by connecting the reset signal System_Reset_N to the "clear" input of the CKE_Control register.

When the reset period is over, the reset signal System_Reset_N returns high and the clock enable signal from the core CKE_From_Core will also be high, but the clock enable,output signal CKE_Off_Chip stays low due to the clock enable control bit signal CKE_Control_bit being low and the feedback signal Feedback being low. It will remain low until the clock enable control bit signal CKE_Control_bit becomes high. If the system was reset due to a "Power-On" reset, the software must set the clock enable control bit signal CKE_Control_bit to '1' prior to any: SDRAM controller initialization so that the initialization sequences that run SDRAM bus transactions are seen by the SDRAM memory modules. If the system was reset due to a "Button-Reset" or some other kind of reset for which memory contents must be preserved, the software will leave the clock enable control bit signal CKE_Control_bit in the '0' state until just before it enables real system refresh again. In this case, the software will setup the SDRAM controller for normal operating conditions while the SDRAM is still in self-refresh mode.

Any SDRAM bus cycles that are run as a result of the initialization of the SDRAM controller will be ignored by the SDRAM because the clock enable signal CKE is inactive. This is desirable because the SDRAM memory will already have been setup correctly prior to the reset and will still be in the correct state. When the SDRAM controller is fully setup, the software will set the clock enable control bit signal CKE _Control_bit to '1' which will cause the clock enable output signal CKE_Off_Chip to go to '1'. The final step is for software to re-enable real system refresh.

The feedback signal Feedback logic allows the clock enable output signal CKE_Off_Chip to remain high even if software toggles the clock enable control bit signal CKE_Control_bit during normal operation. This feature prevents the software from setting the clock enable output signal CKE_Off_Chip to '0' via the refresh controller without using the memory controller to properly do so. When this step is performed through the memory controller, the memory controller issues the proper self-refresh mode commands to the bus prior to setting the clock enable signal from the core CKE_From_Core to '0'. If these commands are not done prior to setting the clock enable signal from the core CKE_From_Core to '0', the SDRAM memory could go to an undefined state and would not enter self-refresh mode.

Although refresh control circuit 300 has been described primarily with reference to operation within a System-On-a-Chip, refresh control circuit 300 may also be implemented as a refresh controller, such as, for example, refresh controller 134 in FIG. 1, and reside outside a memory controller chip within a data processing system such as, for example, data processing system 100 in FIG. 1. In such case, the reset signal System_Reset_N and the clock signal Clock will be available from the data processing system. The clock signal Clock should be the same clock signal used by the SDRAM memory since any data processing system may have many clocks. The clock enable signal from the core CKE_From_Core is the clock enable signal from the chip, usually referred to as CKE_From_Chip, and is the memory controller chip's CKE output to the system SDRAM. The clock enable,signal from the chip will typically be intercepted by the refresh controller, such as, for example, refresh controller 134 in FIG. 1, before it is received by the SDRAM memory. The clock enable output signal CKE_Off_Chip will be replaced by the clock enable signal to the memory, usually referred to as CKE_To_Mem. The clock enable signal to the memory will be the clock enable signal (CKE) that is sent to the system SDRAM in the present invention. The system bus that is connected to CKE control bit 302 in FIG. 3 may be any bus within the data processing system that has input/output (I/O) transaction run on it. The system bus may be, for example, the processor bus, a PCI bus, or even an ISA bus. Any bus will suffice as long as the software can perform an I/O transaction to that bus to control the clock enable control bit signal CKE_Control_bit.

Figure 4:
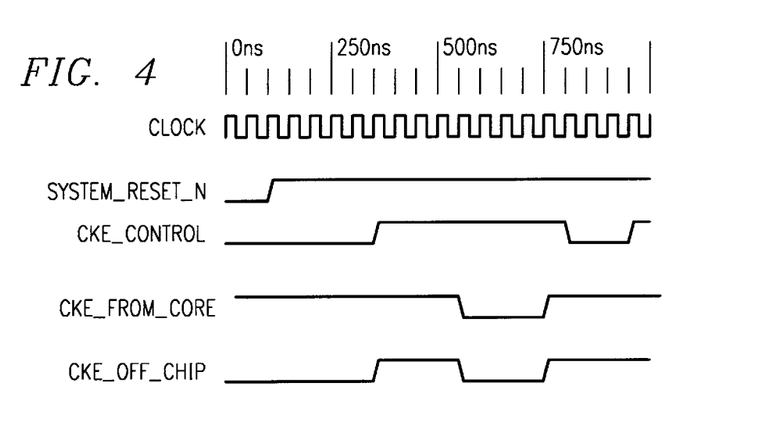
FIG. 4 depicts a timing diagram illustrating the operation of refresh control circuit 300 in FIG. 3 during the Power-On sequence in accordance with the present invention.

With reference now to FIG. 4, a timing diagram illustrating the operation of refresh control circuit 300 in FIG. 3 during the Power-On sequence is depicted in accordance with the present invention. The power-on state of clock enable control bit signal CKE_Control_bit is a '0' and the clock enable signal from the core CKE_From_Core is a '1'. The clock enable output signal CKE_Off_Chip, will remain a '0' until the clock enable control bit signal CKE_Control_bit is set to '1' by software. After that, the clock enable output signal CKE_Off_Chip will follow the transitions of the clock enable signal from the core CKE_From_Core. Also, further changes in the clock enable control bit signal CKE_Control_bit prior to the next reset have no effect on the clock enable output signal CKE_Off_Chip.

Figure 5:
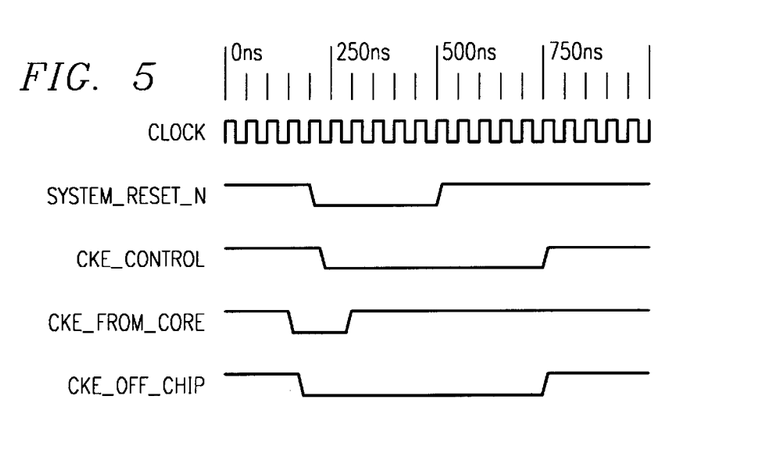
FIG. 5 depicts a timing diagram illustrating the operation of refresh control circuit 300 in FIG. 3 during a "hot-reset" in accordance with the present invention; an FIG. 6 depicts a flowchart illustrating a process for maintaining self-refresh mode for an SDRAM memory device during periods of system reset in accordance with the present invention.

With reference now to FIG. 5, a timing diagram illustrating the operation of refresh control circuit 300 in FIG. 3 during a "hot-reset", i.e. a reset that occurs after the system has been running in normal mode for some time, is depicted in accordance with the present invention. The "hot-reset" may have occurred, for example, due to the operator pushing the reset button or as the result of a watchdog timer expiring. Of course, there are other possible actions within the system that may also cause the "hot-reset" to occur. The clock enable signal from the core CKE _From_Core goes low as a result of the Interrupt Service Routine putting the SDRAM into self-refresh mode. This causes the clock enable output signal CKE_Off_Chip go to '0'. The Interrupt Service Routine then activates the reset signal System_Reset_N by doing a soft-reset. This causes the clock enable control bit signal CKE _Control_bit to go to '0' and eventually causes the clock enable signal from the core CKE From_Core to go to '1'. The clock enable output signal CKE_Off_Chip remains '0' throughout the reset period and after the reset signal System_Reset_N goes to '1'. The clock enable output signal CKE_Off_Chip goes to '1' when software sets the clock enable control bit signal CKE_Control bit.

Note that in FIG. 4 and FIG. 5 the number of clocks in between events are not meant to indicate an actual number of clock cycles between events, but is shown merely as an illustration of relative occurrences of events. In practice, the reset signal System_Reset_N may typically be low for a large number of clock cycles and there may be a large number of clocks cycles between, for example, the reset signal System_Reset_N going high and clock enable control bit signal CKE_Control_bit going high.

Figure 6:
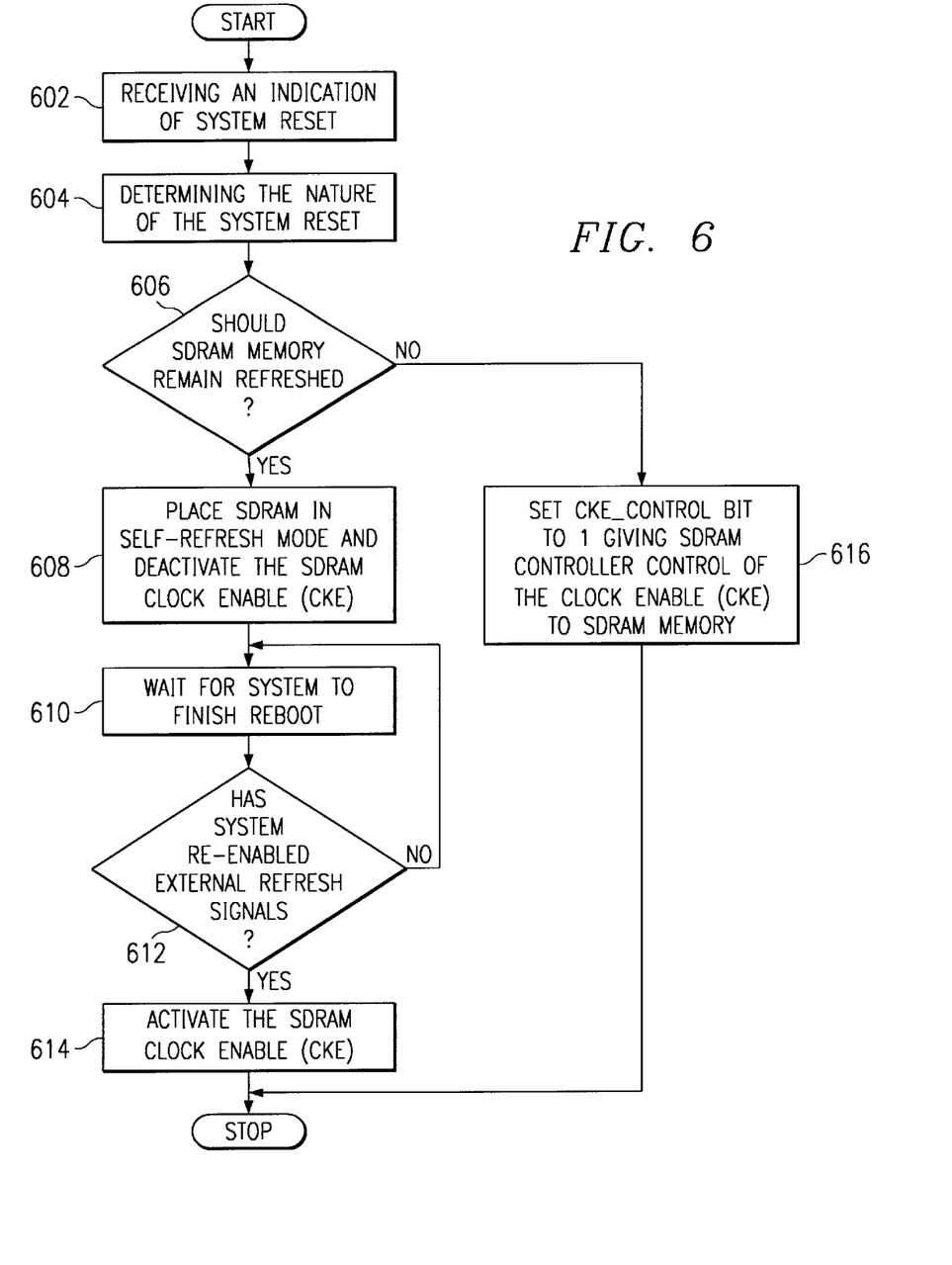

With reference now to FIG. 6, a flowchart illustrating a process for maintaining self-refresh mode for an SDRAM memory device during periods of system reset is depicted in accordance with the present invention. To begin, a data processing system receives an indication that the system will be reset (step 602). The data processing system then determines the nature of the reset indication (step 604). For example, the reset may be a "button" reset in which the user has pushed the reset button on the computer perhaps because the system has become hung, or the reset may be due to the power being turned on to the system.

Once the nature of the system reset is determined, the data processing system determines whether the SDRAM memory should remain refreshed using self-refresh mode during the period of reset until external refresh can be re-enabled (step 606). If there is no need to keep SDRAM memory refreshed, such as, because the system is being powered up from a powered down condition, then the system needs to enable the CKE_Control bit in the refresh controller right away to allow the software to setup the SDRAM controller for normal operation (step 616). If there is a need to keep the SDRAM memory refreshed, then the data processing system tells the SDRAM controller to put the SDRAM into self-refresh mode which causes the SDRAM controller to send the self-refresh commands to the SDRAM memory, followed by the CKE signal being driven low by the SDRAM controller (step 608). The SDRAM may be needed to remain in self-refresh mode because, for example, the system is being reset by the user due to system hung condition, yet there may be contents in the SDRAM memory which the user may wish to preserve for use after the system has been reset.

The refresh controller remains in control of the CKE signal keeping the SDRAM memory in self-refresh mode while it waits for the system to finish resetting (rebooting) (step 610). The system sets up the SDRAM controller as part of its normal reboot procedure. The system re-enables external refresh as part of that SDRAM setup. Just before the system has re-enabled external refresh, it is safe to command the refresh controller to release control of the CKE line. The system does this by writing the CKE_Control bit, setting it high. Once the system sets the CKE_Control bit high, control of the CKE signal to the e SDRAM memory is turned over to the memory controller. This allows the system to reassert control of the SDRAM memory (step 614), at which point the process ends.

Although the present invention has been described primarily with reference to SDRAM memory, it should be noted that the present invention may be applied to any memory that requires refresh and that has a self-refresh capability.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. For example, although a particular configuration for a refresh circuit is depicted, the mechanism of the present invention may be applied to different circuit configurations. The embodiment was chosen and described in order to best explain the principles of the invention, the practical application, and to enable others of ordinary skill in the art to understand the invention for various embodiments with various modifications as are suited to the particular use contemplated.

What is claimed is:

1. A data processing system; comprising:

a processor coupled to a bus;

a memory device controller coupled to the bus;

a refresh controller coupled to memory device controller; and a self-refreshable memory device coupled to the memory device controller; wherein the refresh controller preserves contents within the self-refreshable memory device during periods: of system reset, and wherein when the memory device controller sends a signal to the self-refreshable memory device to reinitialize the self-refreshable memory device, the refresh controller modifies the signal to maintain the self-refreshable memory device in a self-refresh mode until external refresh signals are re-enabled.

2. The data processing system as recited in claim 1, wherein the self-refreshable memory device is a synchronous dynamic random access memory.

3. The data processing system as recited in claim 1, wherein the refresh controller is also coupled to the bus.

4. The data processing system as recited in claims 1, wherein the data processing system is a system-on-a-chip.

5. The data processing system as recited in claim 4, wherein the system-on-a-chip is an application specific integrated circuit.

6. The data processing system as recited in claim 4, wherein the system-on-a-chip is a programmable array logic chip.

7. The data processing system as recited in claim 4, wherein the system-on-a-chip is a programmable array logic chip.

8. A refresh control circuit for preserving the contents of a self-refreshable memory device, comprising:

a decoder for interpreting signals from a data processing system in which the refresh control circuit resides;

an OR gate;

an AND gate; and a latch; wherein the decoder has an output coupled to a first input of the OR gate and has an input coupled to a system reset signal;

the AND gate has a first input coupled to an output of the OR gate, has a second input coupled to the system reset signal, and has a third input coupled to a clock enable signal from the data processing system;

the AND gate has an output coupled to an input of the latch and to a self-refreshable memory device; and the output of the latch is coupled to a second input of the OR gate.

9. The refresh control circuit as recited in claim 8, wherein the data processing system is a system-on-a-chip and the clock enable signal is generated by a core of the system-on-a-chip.

10. The refresh control circuit as recited in claim 9, wherein the system-on-a-chip is an application specific integrated circuit.

11. The refresh control circuit as recited in claim 9, wherein the system-on-a-chip is a programmable array logic chip.

12. The refresh control circuit as recited in claim 9, wherein the system-on-a-chip is a field programmable array logic chip.

13. The refresh control circuit as recited in claim 8, wherein the self-refreshable memory device is a synchronous dynamic random access memory.

* * * * *

UNITED STATES PATENT AND TRADEMARK OFFICE
CERTIFICATE OF CORRECTION

PATENT NO. : 6,829,677 B1
DATED : December 7, 2004
INVENTOR(S) : Attaway et al.

Page 1 of 1

It is certified that error appears in the above-identified patent and that said Letters Patent is hereby corrected as shown below:

Column 2,
Line 10, after "FIG. 1" delete "is" and insert -- depicts --.

Column 9,
Line 10, after "periods" delete ":".
Line 17, after "re-enabled" delete "." and insert
-- , and wherein the refresh controller comprises an AND gate, an OR gate, and a latch providing a feedback loop, wherein the output of the AND gate controls a signal to the memory controller which maintains the contents of the self-refreshable memory during periods of system reset. --.
Line 23, after "recited in" delete "claims" and insert -- claim --.
Line 32, after "is a" insert -- field --.

Signed and Sealed this

Twenty-eighth Day of March, 2006

JON W. DUDAS
*Director of the United States Patent and Trademark Office*